United States Patent
Curtis et al.

(10) Patent No.: US 9,130,084 B2
(45) Date of Patent: Sep. 8, 2015

(54) LIQUID PRECURSOR FOR DEPOSITION OF COPPER SELENIDE AND METHOD OF PREPARING THE SAME

(71) Applicants: Alliance for Sustainable Energy, LLC, Golden, CO (US); HelioVolt Corporation, Austin, TX (US)

(72) Inventors: Calvin J. Curtis, Lakewood, CO (US); Alexander Miedaner, Boulder, CO (US); Marinus Franciscus Antonius Maria Van Hest, Lakewood, CO (US); David S. Ginley, Evergreen, CO (US); Peter A. Hersh, Denver, CO (US); Louay Eldada, Austin, TX (US); Billy J. Stanbery, Austin, TX (US)

(73) Assignee: Alliance for Substainable Energy, LLC, Golden, CO (US)

( * ) Notice: Subject to any disclaimer, the term of this patent is extended or adjusted under 35 U.S.C. 154(b) by 0 days.

(21) Appl. No.: 14/026,516

(22) Filed: Sep. 13, 2013

(65) Prior Publication Data

US 2014/0087512 A1    Mar. 27, 2014

Related U.S. Application Data

(63) Continuation of application No. 13/068,661, filed on May 17, 2011, now abandoned.

(60) Provisional application No. 61/396,053, filed on May 21, 2010.

(51) Int. Cl.
*H01L 31/032* (2006.01)
*H01L 21/02* (2006.01)
*H01L 31/18* (2006.01)

(52) U.S. Cl.
CPC ...... *H01L 31/0322* (2013.01); *H01L 21/02568* (2013.01); *H01L 21/02628* (2013.01); *H01L 31/18* (2013.01); *Y02E 10/541* (2013.01)

(58) Field of Classification Search
CPC ..... H01L 21/06; H01L 21/208; H01L 31/032; H01L 31/18; C09D 7/12
USPC .................. 438/95, 102; 106/287.18, 287.17; 257/E21.068; 252/500, 514; 423/508, 423/23, 493, 557
See application file for complete search history.

(56) References Cited

U.S. PATENT DOCUMENTS

| 2,838,149 A | 6/1958 | Burton |
| 2,846,343 A | 8/1958 | Mason |

(Continued)

FOREIGN PATENT DOCUMENTS

| CA | 2712114 | 8/2009 |
| CN | 15472760 | 11/2004 |

(Continued)

OTHER PUBLICATIONS

Ridley, "Printed Inorganic Transistors", Dissertation, Massachusetts Institute of Technology, Sep. 2003, pp. 1-175.

(Continued)

*Primary Examiner* — Mark Kopec
*Assistant Examiner* — Danny N Kang
(74) *Attorney, Agent, or Firm* — Michael A. McIntyre; Suzanne C. Walts

(57) ABSTRACT

Liquid precursors containing copper and selenium suitable for deposition on a substrate to form thin films suitable for semiconductor applications are disclosed. Methods of preparing such liquid precursors and methods of depositing a precursor on a substrate are also disclosed.

15 Claims, 7 Drawing Sheets

$$2Se^0 + \tfrac{1}{2}N_2H_4 \xrightarrow{\text{Solvent}} Se_2^{2-} + 2H^+ + \tfrac{1}{2}N_2 \quad (1)$$

$$Se_2^{2-} + Cu^{2+}\ \text{salt} \xrightarrow{\text{Solvent}} CuSe_2 + \text{insoluble solid} \quad (2)$$
(Soluble) (Soluble)

$$CuSe_2 + \text{insoluble solid} \xrightarrow{\text{Filtration}} CuSe_2 \quad (3)$$
(Soluble) (Soluble)
↓
Solid material,
CuSe + Cu₂Se

(56) References Cited

U.S. PATENT DOCUMENTS

| | | |
|---|---|---|
| 3,014,779 A | 12/1961 | Conn et al. |
| 3,629,036 A | 12/1971 | Issacson |
| 4,088,544 A | 5/1978 | Hutkin |
| 4,267,398 A | 5/1981 | Rothwarf |
| 4,315,097 A | 2/1982 | Solomon |
| 4,322,571 A | 3/1982 | Stanbery |
| 4,392,451 A | 7/1983 | Mickelsen et al. |
| 4,479,847 A | 10/1984 | McCaldin et al. |
| 4,523,051 A | 6/1985 | Mickelsen et al. |
| RE31,968 E | 8/1985 | Mickelsen et al. |
| 4,571,448 A | 2/1986 | Barnett |
| 4,609,820 A | 9/1986 | Miyamoto |
| 4,611,091 A | 9/1986 | Choudary et al. |
| 4,674,434 A | 6/1987 | Ishihara |
| 4,737,384 A | 4/1988 | Murthy et al. |
| 4,823,176 A | 4/1989 | Baliga et al. |
| 4,864,599 A | 9/1989 | Seagusa et al. |
| 4,902,395 A | 2/1990 | Yoshimura |
| 4,902,398 A | 2/1990 | Homstad |
| 4,902,668 A | 2/1990 | Whitcomb et al. |
| 5,028,274 A | 7/1991 | Basol et al. |
| 5,055,150 A | 10/1991 | Rosenfeld et al. |
| 5,124,308 A | 6/1992 | Albin et al. |
| 5,124,309 A | 6/1992 | Egashira |
| 5,132,248 A | 7/1992 | Drummond et al. |
| 5,178,967 A | 1/1993 | Rosenfeld et al. |
| 5,248,621 A | 9/1993 | Sano |
| 5,298,449 A | 3/1994 | Kikuchi |
| 5,396,839 A | 3/1995 | Rice |
| 5,405,802 A | 4/1995 | Yamagata et al. |
| 5,436,204 A | 7/1995 | Albin et al. |
| 5,441,897 A | 8/1995 | Noufi et al. |
| 5,477,088 A | 12/1995 | Rockett et al. |
| 5,477,288 A | 12/1995 | Miyazaki et al. |
| 5,567,469 A | 10/1996 | Wada et al. |
| 5,578,503 A | 11/1996 | Karg et al. |
| 5,626,688 A | 5/1997 | Probst et al. |
| 5,628,817 A | 5/1997 | Fugleberg et al. |
| 5,674,555 A | 10/1997 | Birkmire et al. |
| 5,687,218 A | 11/1997 | Nakayama |
| 5,705,011 A | 1/1998 | Bodford et al. |
| 5,730,852 A | 3/1998 | Bhattacharya et al. |
| 5,731,031 A | 3/1998 | Bhattacharya et al. |
| 5,756,240 A | 5/1998 | Roberts et al. |
| 5,759,954 A | 6/1998 | Taguchi et al. |
| 5,794,163 A | 8/1998 | Paterson et al. |
| 5,846,638 A | 12/1998 | Meissner |
| 5,858,121 A | 1/1999 | Wada et al. |
| 5,858,628 A | 1/1999 | Yoshida et al. |
| 5,948,176 A | 9/1999 | Ramanathan et al. |
| 5,985,691 A | 11/1999 | Basol et al. |
| 6,021,207 A | 2/2000 | Puthuff et al. |
| 6,023,020 A | 2/2000 | Nishitani et al. |
| 6,026,082 A | 2/2000 | Astrin |
| 6,072,818 A | 6/2000 | Hayakawa |
| 6,100,165 A | 8/2000 | Sakaguchi et al. |
| 6,121,541 A | 9/2000 | Arya |
| 6,126,740 A | 10/2000 | Schulz et al. |
| 6,127,202 A | 10/2000 | Kapur et al. |
| 6,141,356 A | 10/2000 | Gorman |
| 6,146,979 A | 11/2000 | Henley et al. |
| 6,185,418 B1 | 2/2001 | MacLellan et al. |
| 6,187,653 B1 | 2/2001 | Hui et al. |
| 6,190,453 B1 | 2/2001 | Boydston et al. |
| 6,225,190 B1 | 5/2001 | Bruel et al. |
| 6,225,199 B1 | 5/2001 | Han et al. |
| 6,251,754 B1 | 6/2001 | Ohshima et al. |
| 6,313,479 B1 | 11/2001 | Zhang et al. |
| 6,323,417 B1 | 11/2001 | Gillespie et al. |
| 6,339,695 B1 | 1/2002 | Clark |
| 6,368,892 B1 | 4/2002 | Arya |
| 6,372,538 B1 | 4/2002 | Wendt et al. |
| 6,379,585 B1 * | 4/2002 | Vecht et al. ............... 252/301.35 |
| 6,399,486 B1 | 6/2002 | Chen et al. |
| 6,455,398 B1 | 9/2002 | Fonstad, Jr. et al. |
| 6,475,354 B1 | 11/2002 | Toyama |
| 6,500,733 B1 | 12/2002 | Stanbery |
| 6,521,511 B1 | 2/2003 | Inoue et al. |
| 6,559,372 B2 | 5/2003 | Stanbery |
| 6,576,291 B2 | 6/2003 | Bawendi et al. |
| 6,593,213 B2 | 7/2003 | Stanbery |
| 6,599,378 B2 | 7/2003 | Hagiware et al. |
| 6,669,830 B1 | 12/2003 | Inoue et al. |
| 6,720,239 B2 | 4/2004 | Stanbery |
| 6,736,986 B2 | 5/2004 | Stanbery |
| 6,787,012 B2 | 9/2004 | Stanbery |
| 6,797,874 B2 | 9/2004 | Stanbery |
| 6,821,337 B2 | 11/2004 | Bawendi et al. |
| 6,830,778 B1 | 12/2004 | Schulz et al. |
| 6,852,920 B2 | 2/2005 | Sager et al. |
| 6,855,202 B2 | 2/2005 | Alivisatos et al. |
| 6,881,647 B2 | 4/2005 | Stanbery |
| 6,936,761 B2 | 8/2005 | Pichler |
| 6,974,976 B2 | 12/2005 | Hollars |
| 6,979,370 B2 | 12/2005 | Vaartstra |
| 6,987,071 B1 | 1/2006 | Bollman et al. |
| 7,045,205 B1 | 5/2006 | Sager |
| 7,094,651 B2 | 8/2006 | Mitzi et al. |
| 7,097,902 B2 | 8/2006 | Blanton et al. |
| 7,306,823 B2 | 12/2007 | Sager et al. |
| 7,341,917 B2 | 3/2008 | Milliron et al. |
| 7,390,715 B2 | 6/2008 | Ou et al. |
| 7,422,696 B2 | 9/2008 | Mirkin et al. |
| 7,663,057 B2 | 2/2010 | Yu et al. |
| 7,691,294 B2 | 4/2010 | Chung et al. |
| 7,838,063 B2 | 11/2010 | Yoon |
| 7,867,413 B2 | 1/2011 | Lee et al. |
| 7,879,696 B2 | 2/2011 | Kunze et al. |
| 7,922,804 B2 | 4/2011 | Chuang |
| 8,021,641 B2 | 9/2011 | Curtis et al. |
| 8,048,477 B2 | 11/2011 | Van Duren et al. |
| 8,057,850 B2 | 11/2011 | Curtis et al. |
| 8,366,967 B2 | 2/2013 | Keszler et al. |
| 2002/0006470 A1 | 1/2002 | Eberspacher et al. |
| 2002/0016188 A1 | 2/2002 | Kashiwamura |
| 2002/0043279 A1 | 4/2002 | Karg |
| 2003/0051664 A1 | 3/2003 | Stanbery |
| 2003/0052391 A1 | 3/2003 | Stanbery |
| 2003/0054582 A1 | 3/2003 | Stanbery |
| 2003/0054662 A1 | 3/2003 | Stanbery |
| 2003/0054663 A1 | 3/2003 | Stanbery |
| 2003/0123167 A1 | 7/2003 | Kolberg et al. |
| 2003/0201010 A1 | 10/2003 | Koyannagi et al. |
| 2004/0063320 A1 | 4/2004 | Hollars |
| 2004/0131792 A1 | 7/2004 | Bhattacharya |
| 2004/0219730 A1 | 11/2004 | Basol |
| 2004/0250848 A1 | 12/2004 | Sager et al. |
| 2004/0261841 A1 | 12/2004 | Negami et al. |
| 2005/0000414 A1 | 1/2005 | Culik et al. |
| 2005/0009225 A1 | 1/2005 | Mitzi et al. |
| 2005/0028861 A1 | 2/2005 | Aoki et al. |
| 2005/0084689 A1 | 4/2005 | Hwang et al. |
| 2005/0095422 A1 | 5/2005 | Sager et al. |
| 2005/0098204 A1 | 5/2005 | Roscheisen et al. |
| 2005/0098205 A1 | 5/2005 | Roscheisen et al. |
| 2005/0109392 A1 | 5/2005 | Hollars |
| 2005/0121068 A1 | 6/2005 | Sager et al. |
| 2005/0158909 A1 | 7/2005 | Milliron et al. |
| 2005/0183767 A1 | 8/2005 | Yu et al. |
| 2005/0183768 A1 | 8/2005 | Roscheisen et al. |
| 2005/0186342 A1 | 8/2005 | Sager et al. |
| 2005/0218377 A1 | 10/2005 | Lawandy |
| 2006/0062902 A1 | 3/2006 | Sager et al. |
| 2006/0207644 A1 | 9/2006 | Robinson et al. |
| 2007/0077429 A1 | 4/2007 | Mirkin et al. |
| 2007/0093006 A1 | 4/2007 | Basol |
| 2007/0119522 A1 | 5/2007 | Grier et al. |
| 2007/0152236 A1 | 7/2007 | Halpert et al. |
| 2007/0163638 A1 | 7/2007 | Van Duren et al. |
| 2007/0163642 A1 | 7/2007 | Van Duren et al. |
| 2007/0163643 A1 | 7/2007 | Van Duren et al. |
| 2007/0163644 A1 | 7/2007 | Van Duren et al. |
| 2007/0166453 A1 | 7/2007 | Van Duren et al. |
| 2007/0169813 A1 | 7/2007 | Robinson et al. |

(56) References Cited

U.S. PATENT DOCUMENTS

| | | |
|---|---|---|
| 2007/0178620 A1 | 8/2007 | Basol |
| 2007/0234949 A1 | 10/2007 | Ahan et al. |
| 2007/0261951 A1 | 11/2007 | Ye et al. |
| 2007/0264504 A1 | 11/2007 | Mitzi et al. |
| 2008/0057616 A1 | 3/2008 | Robinson et al. |
| 2008/0121277 A1 | 5/2008 | Robinson et al. |
| 2008/0124831 A1 | 5/2008 | Robinson et al. |
| 2008/0135099 A1 | 6/2008 | Yu et al. |
| 2008/0142081 A1 | 6/2008 | Yu et al. |
| 2008/0142082 A1 | 6/2008 | Yu et al. |
| 2008/0149176 A1 | 6/2008 | Sager et al. |
| 2008/0175982 A1 | 7/2008 | Robinson et al. |
| 2008/0194103 A1 | 8/2008 | Wagner |
| 2008/0242088 A1 | 10/2008 | Suzuki |
| 2009/0004445 A1 | 1/2009 | Park et al. |
| 2009/0214763 A1 | 8/2009 | Joo et al. |
| 2009/0226603 A1 | 9/2009 | Lowrey |
| 2009/0260670 A1 | 10/2009 | Li |
| 2009/0261951 A1 | 10/2009 | Chang et al. |
| 2009/0280624 A1 | 11/2009 | Curtis et al. |
| 2009/0305449 A1 | 12/2009 | Bollman et al. |
| 2010/0096015 A1 | 4/2010 | Robinson et al. |
| 2010/0319776 A1 | 12/2010 | Choe et al. |
| 2011/0008244 A1 | 1/2011 | Brutchey et al. |
| 2011/0014377 A1 | 1/2011 | Mosley |
| 2011/0020981 A1 | 1/2011 | Mosley et al. |
| 2011/0065224 A1 | 3/2011 | Bollman et al. |
| 2011/0076798 A1 | 3/2011 | Calzia et al. |
| 2011/0076799 A1 | 3/2011 | Calzia et al. |
| 2011/0120343 A1 | 5/2011 | Calzia et al. |
| 2011/0143051 A1 | 6/2011 | Ohashi et al. |
| 2011/0189080 A1 | 8/2011 | Curtis et al. |
| 2011/0287610 A1 | 11/2011 | Calzia et al. |
| 2011/0287614 A1 | 11/2011 | Calzia et al. |
| 2011/0312160 A1 | 12/2011 | Eldada et al. |
| 2012/0082794 A1 | 4/2012 | Calzia et al. |
| 2012/0094431 A1 | 4/2012 | Curtis et al. |
| 2012/0213924 A1 | 8/2012 | Mosley et al. |
| 2013/0078384 A1 | 3/2013 | Mosley et al. |
| 2013/0323878 A1 | 12/2013 | Curtis et al. |
| 2014/0087512 A1 | 3/2014 | Curtis et al. |

FOREIGN PATENT DOCUMENTS

| | | |
|---|---|---|
| CN | 101079454 | 11/2007 |
| DE | 4225385 | 2/1994 |
| EP | 0381509 | 8/1990 |
| EP | 0621130 | 10/1994 |
| EP | 0661760 | 5/1995 |
| EP | 0763859 | 3/1997 |
| EP | 1870943 | 12/1998 |
| EP | 0989593 | 3/2000 |
| EP | 1255305 | 6/2002 |
| EP | 1385364 | 1/2004 |
| GB | 1119372 | 7/1968 |
| GB | 1194625 | 6/1970 |
| JP | 2003282600 | 10/2003 |
| JP | 2009528681 | 8/2009 |
| JP | 2009528682 | 8/2009 |
| JP | 2009540537 | 11/2009 |
| JP | 2010132521 | 6/2010 |
| KR | 102002000777 | 1/2002 |
| WO | 97/22152 | 6/1997 |
| WO | 00/33363 | 6/2000 |
| WO | 03/002225 | 1/2003 |
| WO | 03/026022 | 3/2003 |
| WO | 03/026023 | 3/2003 |
| WO | 03/026024 | 3/2003 |
| WO | 03/026025 | 3/2003 |
| WO | 03/026026 | 3/2003 |
| WO | 03/026028 | 3/2003 |
| WO | 2005/017978 | 2/2005 |
| WO | 2005/059952 | 6/2005 |
| WO | 2006/041199 | 4/2006 |
| WO | 2006/101986 | 9/2006 |
| WO | 2006/133129 | 12/2006 |
| WO | 2007/082080 | 7/2007 |
| WO | 2007/082084 | 7/2007 |
| WO | 2007/082085 | 7/2007 |
| WO | 2008/021604 | 2/2008 |
| WO | 2008/027571 | 3/2008 |
| WO | 2008/057119 | 5/2008 |
| WO | 2008/063190 | 5/2008 |
| WO | WO 2008063190 A2 * | 5/2008 |
| WO | 2009/051862 | 4/2009 |
| WO | 2009/151665 | 12/2009 |
| WO | 2010/135665 | 11/2010 |
| WO | 2010/135667 | 11/2010 |
| WO | 2010/138635 | 12/2010 |
| WO | 2010/138636 | 12/2010 |
| WO | 2011/096914 | 8/2011 |
| WO | 2011/146115 | 11/2011 |
| WO | 2012/023973 | 2/2012 |

OTHER PUBLICATIONS

Sankir, "Flexible Electronics: Materials and Device Fabrication", Dissertation, Virginia Polytechnic Institute, Dec. 7, 2005.

Schock, "Thin Film Photovoltaics", Applied Surface Science, Feb. 2, 1996, vol. 92, pp. 606-616.

Şengül et al., "Toward Sustainable Nanoproducts, An Overview of Nanomanufacturing Methods", Journal of Industrial Ecology, 2008, vol. 12, No. 3, pp. 329-359.

Stanbery et al., "Role of Sodium in the Control of Defect Structures in CIS [solar cells]," Photovoltaic Specialists Conference, 2000. Conference Record of the Twenty-Eighth IEEE, Sep. 2000, pp. 440-445.

Stanbery, "Copper Indium Selenides and Related Materials for Photovoltaic Devices," Critical Reviews in Solid State and Material Sciences, Apr.-Jun. 2002, vol. 27, No. 2, pp. 73-117.

Stanbery, "The Intra-absorber Junction (IAJ) Model for the Device Physics of Copper Indium Gallium Selenide-based Photovoltaics," 0-7803-8707-4/05, IEEE, presented Jan. 5, 2005, pp. 355-358.

Stanbery, et al., "XPS Studies of Sodium Compound Formation and Surface Segregation in CIGS Thin Films [Solar Cells]" Photovoltaic Specialists Conference, 1997, Conference Record of the Twenty-Sixth IEEE, Sep.-Oct. 1997, pp. 499-502.

Teherán, et al, "Evolution of the Phases and Chemical Composition During the Formation of CIS Thin Films prepared by Interdiffusion Process in Selenides Layers", Journal of Crystal Growth, Jan. 1998, vol. 183, pp. 352-360.

Tuttle et al., "A 15.2% AMO/1433 W/kg Thin-film Cu(In,Ga)Se2 Solar Cell for Space Applications", Photovoltaic Specialists Conference, 2000. Conference Record of the Twenty-Eighth IEEE, Sep. 2000, pp. 1042-1045.

Xu et al., "Sonochemical Synthesis of Copper Selenides Nanocrystals with Different Phases", Journal of Crystal Growth, 2002, vol. 234, pp. 263-266.

Yan et al., "Chemical Fluctuation-induced Nanodomains in Cu(In,Ga)Se2 Films", Applied Physics Letters, 2005, vol. 87, No. 12, pp. 121904-1-121904-3.

Yang et al., "The Spectroscopy of InSe Nanoparticles", The Journal of Physical Chemistry B, Jul. 2005, vol. 109, No. 26, pp. 12701-12709.

Yin et al., "Colloidal Nanocrystal Synthesis and the Organic-inorganic Interface", Nature, Sep. 2005, vol. 437, pp. 664-670.

International Search Report and Written Opinion for International (PCT) Application No. PCT/US2011/001434, Feb. 22, 2012, pp. 1-9.

International Preliminary Report on Patentability for International (PCT) Application No. PCT/US2011/001434, issued Feb. 19, 2013, pp. 1-6.

International Search Report and Written Opinion for International (PCT) Application No. PCT/US2006/060757, Nov. 20, 2008, pp. 1-5.

International Preliminary Report on Patentability for International (PCT) Application No. PCT/US2006/060757, issued May 12, 2009, pp. 1-4.

International Search Report and Written Opinion for International (PCT) Application No. PCT/US2006/060756, Jul. 30, 2007, pp. 1-6.

(56) References Cited

OTHER PUBLICATIONS

International Preliminary Report on Patentability for International (PCT) Application No. PCT/US2006/060756, issued May 12, 2009, pp. 1-5.
International Search Report and Written Opinion for International (PCT) Application No. PCT/US2011/000870, Sep. 1, 2011, pp. 1-8.
International Preliminary Report on Patentability for International (PCT) Application No. PCT/US2011/000870, issued Nov. 27, 2012, pp. 1-7.
International Search Report and Written Opinion for International (PCT) Application No. PCT/US2010/000311, Apr. 14, 2010, pages.
International Preliminary Report on Patentability for International (PCT) Application No. PCT/US2010/000311, issued Aug. 7, 2012, pp. 1-6.
Anderson et al, "Processing of CuInSe2—Based Solar Cells: Characterization of Deposition Processes in Terms of Chemical Reaction Analyses", Final Report, May 6, 1995-Dec. 31, 1998, National Renewable Energy Laboratory, NREL/SR-520-30391, Jun. 2001, pp. 1-400.
Arya et al, "Solar Cells and Submodules on CIS Prepared by EDCF Method", Photovoltaic Specialists Conference, 1993., Conference Record of the Twenty Third IEEE, May 1993, pp. 516-520.
Braunger et al. "Influence of Sodium on the Growth of Polycrystalline Cu(In,Ga)Se2 Thin Films" Thin Solid Films, Feb. 2000, vol. 361-362, pp. 161-166.
Burda et al., "Chemistry and Properties of Nanocrystals of Different Shapes"; Chemical Reviews, Apr. 2005, vol. 105, No. 4, pp. 1025-1102.
Caglar, "Studies of Inkjet Printing Technology with Focus on Electronic Materials", Tampereen teknillinen yliopisto, Julkaisu—Tampere University of Technology, Publication 863, Doctoral Dissertation, Issue date Jan. 8, 2010, pp. 1-69.
Cahen et al, "Room Temperature Tailoring of Electrical Properties of Ternary and Multinary Chalcogenide Semiconductors", Proceedings of the 9th International Conference of Ternary and Multinary Compounds, Yokohama, 1993; The Japanese Journal of Applied Physics, 1993, vol. 32, Suppl. 32-3, pp. 660-661.
Caspar et al., "Five-fold Symmetry in Crystalline Quasicrystal Lattices", Proceedings of the National Academy of Sciences of the United States of America, Dec. 1996, vol. 93, No. 25, pp. 14271-14278.
Chang et al, "Novel Multilayer Process for CuInSe2 Thin Film Formation by Rapid Thermal Processing", Material Res. Society Symposium Proceedings, 1998, vol. 485, pp. 163-168.
Chen et al., "Thin Film CuInGeSe2 Cell Development", IEEE, 1993, pp. 422-425.
Chun et al., "Synthesis of CuInGaSe2 Nanoparticles by Solvothermal Route," Thin Solid Films, Jun. 2005, vol. 480-481, No. 1, pp. 46-49.
Contreras et al, "Progress Toward 20% Efficiency in Cu(In, Ga)Se2 Polycrystalline Thin-film Solar Cells," Progress in Photovoltaics Research and Applications, Short Communication: Accelerated Publication, Jul./Aug. 1999, vol. 7, No. 4, pp. 311-316.
Cyganik et al., "Substructure Formation during Pattern Transposition from Substrate into Polymer Blend Film", Europhysics Letters, Jun. 2003, vol. 62, No. 6, pp. 855-861.
Dusastre et al., "Convenient, Room-temperature, Amine-assisted Routes to Metal Sulfides, Selenides and Tellurides", Journal of the Chemical Society, Dalton Transactions, 1997, pp. 3505-3508.
Eberspacher et al, "Non-Vacuum Techniques for Fabricating Thin-Film CIGS", IEEE, 2000, pp. 517-520.
Grisaru et al., "Microwave-assisted Polyol Synthesis of CuInTe2 and CuInSe2 Nanoparticles", Inorganic Chemistry, Nov. 2003, vol. 42, No. 22, pp. 7148-7155.
Gullén et al, "Reaction Pathways to CuInSe2 Formation from Electrodeposited Precursors", Journal of the Electrochemical Society, May 2005, vol. 142, No. 6, pp. 1834-1838.
Hassan et al, "Evaluation and Characterization of Polycrystalline CuInSe2 Thin Films Prepared by the Sandwich Structure Technique", Semiconductor Science and Technology, 1994, vol. 9, No. 6, pp. 1255-1260.
Hiraga et al., "Formation of Decagonal Quasicrystal in the Al—Pd—Mn System and its Structure", Japanese Journal of Applied Physics, Sep. 1991, vol. 30, No. 9A, pp. 2028-2034.
Hollingsworth et al., "Catalyzed Growth of a Metastable InS Crystal Structure as Collidial Crystals", Journal of the American Chemical Society, 2000, vol. 122, pp. 3562-3563.
Hua et al., "Electroluminescent Properties of Device Based on ZnS:Tb/CdS Core-shell Nanocrystals", Chemical Physics Letters, 2006, vol. 419, pp. 269-272.
Jiang et al., "Elemental Solvothermal Reaction to Produce Ternary Semiconductor CuInE2(E=S, Se) Nanorods", Inorganic Chemistry, 2000, vol. 39, No. 14, 2964-2965.
Kapur et al, "Lab to Large Scale Transition for Non-Vacuum Thin Film CIGS Solar Cells", Phase I Annual Technical Report, NREL/SR-520-35574, Feb. 2004, pp. 1-18.
Kapur et al, "Lab to Large Scale Transition for Non-Vacuum Thin Film CIGS Solar Cells", Phase II—Annual Technical Report, NREL/SR-520-37284, Jan. 2005, pp. 1-25.
Kapur et al, "Non-vacuum Processing of CuIn1—xGaxSe2 Solar Cells on Rigid and Flexible Substrates Using Nanoparticle Precursor Inks", Proceedings of Symposium B, Thin Film Chalcogenide Photovoltaic Materials, E-MRS, Spring Meeting, Thin Solid Films, May 2003, vol. 431-432, pp. 53-57.
Kazmerski et al., "Thin-film CuInSe2/CdS Heterojunction Solar Cells", Applied Physics Letters, Aug. 1976, vol. 29, No. 4, pp. 268-270 Aug. 1976.
Keyes et al., "Influence of Na on the Electo-optical Properties of Cu(In,Ga)Se2," Photovoltaic Specialists Conference, Conference Record of the Twenty-Sixth IEEE Sep./Oct. 1997, Anaheim, CA, pp. 479-482.
Kumar et al., "Shape Control of II-VI Semiconductor Nanomaterials"; Small, Mar. 2006, vol. 2, No. 3, pp. 316-329.
Lammasniemi et al., "Characteristics of Indium Phosphide Solar Cells Bonded in Silicon", Photovoltaic Specialists Conference, Conference Record of the Twenty Third IEEE, May 1993, pp. 763-767.
Lee et al., "Field-assisted Bonding Below 200° C. Using Metal and Glass Thin-film Interlayers," Applied Physics Letters, Mar. 1987, vol. 50, No. 9, pp. 522-524.
Li et al. "Effects of Buffer Layer Processing on CIGS Excess Carrier Lifetime: Application of Dual-beam Optical Modulation to Process Analysis," Photovoltaic Specialists Conference, Conference Record of the Twenty Fifth IEEE, May 1996, pp. 821-824.
Li et al., "Synthesis by a Solvothermal Route and Characterization of CuInSe2 Nanowhiskers and Nanoparticles" Advanced Materials, Dec. 1999, vol. 11, No. 17, pp. 1456-1459.
Li, et al., "Sonochemical Process for the Preparation of alpha-CuSe Nanocrystals and Flakes", Journal of Materials Chemistry, 2002, vol. 12, pp. 3723-3727.
Lilly, "Metal and Semiconductor Nanoparticle Self-Assembly", Dissertation, University of Michigan, 2009, pp. 1-122.
Malik et al., "Atmospheric Pressure Synthesis of In2Se3, Cu2Se, and CuInSe2 without External Selenization from Solution Precursors", Journal of Materials Research, 2009, vol. 24, No. 4, pp. 1375-1387.
Manna et al., "First-Principles Modeling of Unpassivated and Surfactant-Passivated Bulk Facets of Wurtzite CdSe: A Model System for Studying the Anisotropic Growth of CdSe Nanocrystals"; Journal of Physical Chemistry B, 2005, vol. 109, No. 13, pp. 6183-6192.
Mirasano et al., "The Effect of Annealing Process on CIGS Films Prepared by Chemical Bath Deposition", University of Nebraska, 2007, pp. 1-6.
Mitzi et al., "Hydrazine-based deposition route for device-quality CIGS films", Thin Solid Films, 2009, vol. 517, pp. 2158-2162.
Murray et al., "Synthesis and Characterization of Monodisperse Nanocrystals and Close-packed Nanocrystal Assemblies", Annual Reviews of Materials Science, Aug. 2000, vol. 30, pp. 545-610.

(56) References Cited

OTHER PUBLICATIONS

Nakada et al, "Preparation and Characterization of CuInSe2 Films for PV Applications by Low Pressure Vapor Phase Selenization", Proceedings of the 11th E.C. Photovoltaic Solar Energy Conference, pp. 794-797 Oct. 12-16, 1992.

Noufi et al. "Chemical Fluctuation-induced Nanodomains in Cu(In,Ga)Se2 films," 20th European Photovoltaic Solar Energy Conference, Jun. 6-10, 2005, Barcelona, Spain, pp. 1744-1747.

Nowlan et al. "Direct Cover Glass Bonding to GaAs and GaAs/Ge Solar cells" Proceedings of the Photovoltaic Specialists Conference, Las Vegas, Oct. 7-11, 1991, pp. 1480-1484.

Park et al., "Phase-controlled One-Dimensional Shape Evolution of InSe Nanocrystals", Journal of the American Chemical Society, Oct. 28, 2006, vol. 128, No. 46, pp. 14780-14781.

Peng et al., "Epitaxial Growth of Highly Luminescent CdSe/CdS Core/Shell Nanocrystals with Photostability and Electronic Accessibility", Journal of the American Chemical Society, Jul. 30, 1997, vol. 119, No. 30, pp. 7019-7029.

Pinna et al., "Triangular CDS Nanocrystals: Structural and Optical Studies", Advanced Materials, Feb. 2001, vol. 13, No. 4, pp. 261-264.

Probst et al., "Advanced Stacked Elemental Layer Process for Cu(InGa)Se2 Thin Film Photovoltaic Devices," MRS Proceedings, 1996, vol. 426, pp. 165-176.

Probst et al., "Rapid CIS-process for high efficiency PV-modules: development towards large area processing," Thin Solid Films, 2001, vol. 387, Nos. 1-2, pp. 262-267.

Probst et al., "The Impact of Controlled Sodium Incorporation on Rapid Thermal Processed Du(InGa)Se2—Thin Films and Devices," Photovoltaic Energy Conversion, 1994, Conference Record of the Twenty Fourth IEEE Photovoltaic Specialists Conference, 1994 IEEE First World Conference on Photovoltaic Energy Conversion—WPCPEC, Dec. 1994, pp. 144-147.

Puzder et al., "The Effect of Organic Ligand Binding on the Growth of CdSe Nanoparticles Probed by Ab Initio Calculations", NANO Letters, Oct. 2004, vol. 4, No. 12, pp. 2361-2365.

Revaprasadu et al, "Novel Single-molecule Precursor Routes for the Direct Synthesis of InS and InSe Quantum Dots", Journal of Materials Chemistry, 1999, vol. 9, pp. 2885-2888.

Dhere et al., "Low Toxic Processing of Thin and Ultra-thin CIGSS Absorber Solar Cells", Florida Solar Energy Center, University of Central Florida, pp. 1-2.

Ginley, "Inkjet Direct Write Solar Cells", NREL Project, Dec. 7, 2005, pp. 1-2.

Kerr et al., "Rapid Thermal Processing of CIS Precursors", IEEE, 2002, pp. 676-679.

Leterrier et al., "Mechanical Properties of Transparent Functional Thin Films for Flexible Displays", Society of Vacuum Coaters, 46th Annual Technical Conference Proceedings, 2003, pp. 1-6.

Schulz et al., "CIGS Films Via Nanoparticle Spray Deposition: Attempts at Densifying a Porous Precursor", Presented at the 26th IEEE Photovoltaic Specialists Conference, Sep. 29-Oct. 3, 1997, Anaheim, CA, pp. 1-5.

Stanbery et al., "Reaction Engineering and Precursor Film Deposition for CIS Synthesis", National Renewable Energy Laboratory and Sandia National Laboratories Photovoltaics Program Review Meeting, AIP Conference Proceedings, 1997, vol. 394, pp. 579-588.

Wu et al., "Assembly of Conducting Polymer / Metal Oxide Multiplayer in One Step", Synthetic Metals, 1999, vol. 102, pp. 1268-1269.

Extended European Search Report for for Application No. 06846272.0, dated Feb. 2, 2012, pp. 1-9.

\* cited by examiner

XRD scan of the stacked glass/Mo/In-Ga-Se/Cu-Se precursor film.

Device curve obtained from the CIGS film produced in the liquid Cu-Se precursor.

Device curve obtained from a CIGS film produced using a PVD Cu-Se precursor

LIQUID PRECURSOR FOR DEPOSITION OF COPPER SELENIDE AND METHOD OF PREPARING THE SAME

RELATED APPLICATION

This application claims the benefit of priority from U.S. Provisional Patent Application Ser. No. 61/396,053, entitled "Liquid Precursor for Deposition of Copper Selenide and Method of Preparing the Same," filed May 21, 2010.

CONTRACTUAL ORIGIN

The United States Government has rights in this invention under Contract No. DE-AC36-08GO28308 between the United States Department of Energy and the Alliance for Sustainable Energy, LLC, the Manager and Operator of the National Renewable Energy Laboratory.

BACKGROUND

Compounds of Groups IB, IIIA and VIA, especially copper indium diselenide (CIS) and copper indium gallium diselenide (CIGS), have been studied as semiconductor materials for a number of thin-film semiconductor applications. One key application is their use as light absorbing materials in solar cell components. The elements which form these compounds are relatively common and fairly inexpensive, and when formulated and processed into light absorbing materials (e.g., CIS and CIGS), they are highly efficient in converting solar energy to electrical energy.

Unfortunately, cost effective methods of fabricating these light absorbing materials, especially in the form of thin films have been elusive and limited at best. Most current fabrication methods of light absorbing materials (e.g., CIS and CIGS) rely on vacuum deposition techniques (e.g., physical vapor deposition), which are generally expensive and labor-intensive.

Recent advances in the thin film technology involve the use of liquid precursors to deposit precursors of light absorbing materials. Liquid precursors for use in thin film deposition represent less expensive alternatives to vacuum deposition technology. Liquid precursors provide distinct advantages over conventional vacuum deposition technology including higher throughput, lower cost and more efficient material utilization. In addition, liquid precursors are compatible with a broader range of substrate types and surface morphologies including very large substrates or those having considerable flexibility.

Liquid precursors are generally formulated to contain a combination of metal and a multinary chalcogenide material each selected, respectively, from the elements of Group IB, Group IIIA and Group VIA, utilizing hydrazine as a solvent. Upon deposition, the liquid precursor converts into a desired solid precursor or a metal chalcogenide through the application of heat. The deposited solid precursor can then be processed via suitable means in combination with other solid precursors to produce the final light absorbing material (e.g., CIS and CIGS).

The use of hydrazine as a solvent is problematic. Hydrazine is a volatile, corrosive liquid that is expensive, highly toxic and dangerously unstable. Its use therefore is strictly controlled. For the same reasons, hydrazine-containing liquid precursors require special care and handling, and implementation of extensive safety measures. Thus, the cost and difficulty associated with making and using hydrazine-containing liquid precursors is considerably high.

SUMMARY

The following embodiments and aspects thereof are described and illustrated in conjunction with systems, tools and methods that are meant to be exemplary and illustrative, not limiting in scope. In various embodiments, one or more of the above-described problems have been reduced or eliminated, while other embodiments are directed to other improvements.

An exemplary method of preparing a liquid precursor is disclosed having a copper selenide content defined by the formula $Cu_xSe_y$ wherein x and y are each in the range of 1 to 2 wherein x+y is in the range of 2 to 3. Such liquid precursors are suitable for forming a solid precursor on a substrate, for example, in the form of thin films, which may be used, for example, in semiconductor applications such as the preparation of light absorbing materials for solar cells. The solid precursor is generally formed by heating the liquid precursor to a temperature and for a time sufficient to drive off the liquid components.

The exemplary method produces a liquid precursor in the form of a liquid based material or composition that does not contain hydrazine and can be used in deposition techniques that are easier, more efficient and more cost effective to use than solid based deposition techniques such as vacuum deposition. The exemplary liquid precursors allow for deposition by suitable deposition techniques such as drop coating, dip coating, spin coating, spraying, brushing, air brushing, ink jet application, stamping, printing, pouring, wiping, smearing, spray deposition, slot coating, and other methods of applying liquids to the surface of a substrate. For example, the deposition technique may be spray deposition or slot coating.

The exemplary method eliminates the use of hydrazine as a solvent, thus eliminating all procedures known to be used in handling and removing hydrazine. The resulting liquid precursor is essentially hydrazine-free, thereby greatly enhancing safety and reducing costs of the process of forming the thin films. The exemplary hydrazine-free liquid precursors permit deposition of solid precursors in a safer and more cost effective manner than those, which contain hydrazine. In addition, the exemplary method produces liquid precursors with higher precursor (i.e., copper-selenide) concentration levels, thus reducing the time necessary for generating the solid precursor. The exemplary liquid precursors can be used to form thin films having a desirable copper selenide composition suitable for use in forming CIS or CIGS thin films useful in the fabrication of solar cells.

Accordingly, an exemplary embodiment is directed to a method of preparing a liquid precursor which includes:

reducing elemental selenium with a stoichiometric amount of a nitrogen-containing reducing agent in the presence of a first solvent to yield a preliminary precursor solution; and combining the preliminary precursor solution with a solution of a copper salt and a second solvent, which may be the same or different than the first solvent, to yield the liquid precursor.

Another exemplary embodiment is directed to a method of depositing a solid precursor on a substrate, which includes:

applying a liquid precursor prepared by the exemplary method described above to the substrate; and heating the liquid precursor to a temperature and for a time sufficient to yield the deposited solid precursor on the substrate.

In another exemplary embodiment, there is provided a liquid precursor which includes:

a hydrazine-free solvent for a solute comprising copper and selenium; and a solute comprising copper and selenium.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be considered illustrative rather then limiting.

DETAILED DESCRIPTION

An exemplary liquid precursor and method of preparing the same is disclosed which is suitable for depositing a desired chemical species or precursor (i.e., copper selenide) on a substrate. The deposited desired chemical species can then be heated to remove volatile components including solvent to yield a solid precursor, for example, in the form of a thin film. The solid precursor of the desired chemical species can be used in forming a CIS (copper-indium-selenide) and/or CIGS (copper-indium/gallium-diselenide) light absorbing material for solar cells.

The liquid precursor of one exemplary embodiment does not employ hydrazine as a solvent. Accordingly, there is no hydrazine present in the liquid precursor and therefore special efforts to handle and remove hydrazine are eliminated. The exemplary liquid precursor comprises a molar ratio of Cu:Se of about 1:3. Typically, most of the selenium is associated with the copper while a minor portion of selenium will be present in elemental form. The liquid precursor exhibits a relatively high concentration level of copper and selenium suitable for rapidly depositing a thin film on a substrate. The copper concentration in this liquid precursor is in the range of from about 0.08 M to about 0.10 M, whereas prior art liquid precursors with hydrazine as a solvent typically have a copper concentration of from 0.02 M to 0.04 M.

Copper selenide-containing thin films are useful in the fabrication of CIS and/or CIGS light absorbing materials for solar cells. The copper selenide layer and the indium and/or gallium selenide layer(s) are placed into contact under reactive conditions including heat to form a desirable light absorbing material. An exemplary form of copper selenide for the light absorbing material is CuSe and/or $CuSe_2$. During heating to form the light absorbing material the amount and duration of heat can be tailored to control the molar ratio of Cu:Se. One such example is disclosed in U.S. patent application Ser. No. 12/658,204, filed Feb. 4, 2010, incorporated herein by reference. Still other examples are also contemplated.

In an exemplary embodiment, there is provided a method of preparing a liquid precursor composition having a desirable copper selenide content. The liquid precursor can be applied to a substrate such as glass and simultaneously thermally treated in a manner which provides a solid precursor, for example, in the form of a thin film, having a target copper selenide content as described above. The Cu:Se ratio may determined by any suitable chemical analysis technique such as, for example, inductively coupled plasma atomic emission spectroscopy (ICP-AES).

Figure 1:
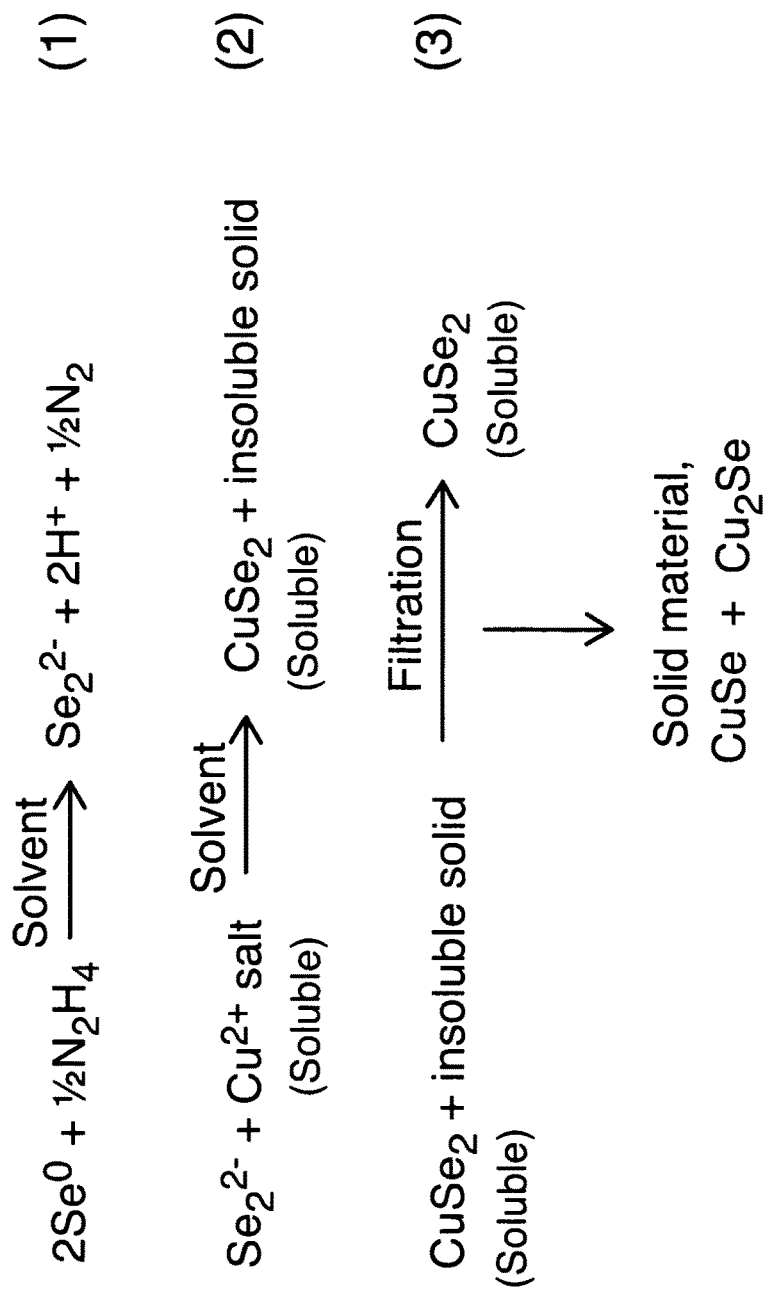
FIG. 1 is a schematic view of chemical reaction steps of an exemplary embodiment of a method for preparing a liquid precursor.

An exemplary method for preparing one exemplary embodiment of the liquid precursor is represented in FIG. 1. The exemplary method involves reducing elemental selenium with a stoichiometric amount of nitrogen-containing reducing agent, such as hydrazine, in the presence of a first solvent (excluding hydrazine) to yield a preliminary precursor solution, and combining the preliminary precursor solution with a solution of a copper salt and a second solvent (excluding hydrazine) to yield the liquid precursor as indicated by equations (1) and (2), respectively. Typically, any precipitate formed during the combining step is separated from the liquid precursor as indicated by equation (3). The precipitate may be separated from the liquid precursor by any suitable separation technique including, but not limited to, filtration, and centrifugation.

The term "nitrogen-containing reducing agent" is intended to refer to a chemical compound, typically containing nitrogen, which exhibits a standard reduction potential less than the standard reduction potential of selenium, and which is consumed in the oxidation-reduction reaction with selenium to yield by-products which do not adversely affect the reducing reaction and are relatively harmless from an, environmental standpoint. An exemplary example of the nitrogen-containing reducing agent is hydrazine.

As discussed above, the nitrogen-containing reducing agent, for example, hydrazine, is used to reduce elemental selenium in the presence of a first solvent to form the preliminary precursor solution as indicated in equation (1) of FIG. 1. The term "preliminary precursor solution" is intended to refer to the mixture of the reduced elemental selenium and the first solvent prior to mixing with a solution of a copper salt and a second solvent.

The copper salt may be selected from any soluble copper salts including $Cu^{+2}$ salts such as, for example, copper chloride, copper bromide, copper iodide, copper acetate, copper formate, copper nitrate, copper trifluoromethanesulfonate, and the like. The first solvent is any solvent which facilitates the reduction reaction of selenium (see Equation 1 of FIG. 1). The second solvent is any solvent which facilitates the reaction shown in Equation 2 of FIG. 1. Examples of the first and second solvents include, but are not limited to, amines including primary and secondary amines, and glycols. Further examples of the first and second solvents include, but are not limited to, ethylene diamine, pyridine, ethanolamine, diethylene triamine, and ethylene glycol. The first and second solvents may be the same or different.

The nitrogen-containing reducing agent (e.g., hydrazine) is reacted with elemental selenium in stoichiometric amounts. In the exemplary method, utilizing hydrazine as a reducing agent (not as a solvent) in a stoichiometric amount ensures that hydrazine is completely consumed in the reaction with elemental selenium yielding nitrogen gas.

The preliminary precursor solution is thereafter combined or blended with the solution of the copper salt and the second solvent to yield the liquid precursor as indicated in equation (2) of FIG. 1. As indicated in equation (3) of FIG. 1, any precipitate formed from the reaction of the preliminary precursor solution and the copper salt may be separated from the resulting liquid precursor using conventional separation techniques (e.g., filtration, centrifugation).

In an exemplary method of depositing a solid precursor on a substrate, the resulting exemplary liquid precursor is applied to the substrate under elevated temperature conditions for a time sufficient to remove the solvent and other volatile components. During this thermal process step, the exemplary liquid precursor converts into a solid precursor (i.e., Cu—Se), for example, in the form of a thin film.

Figure 2:
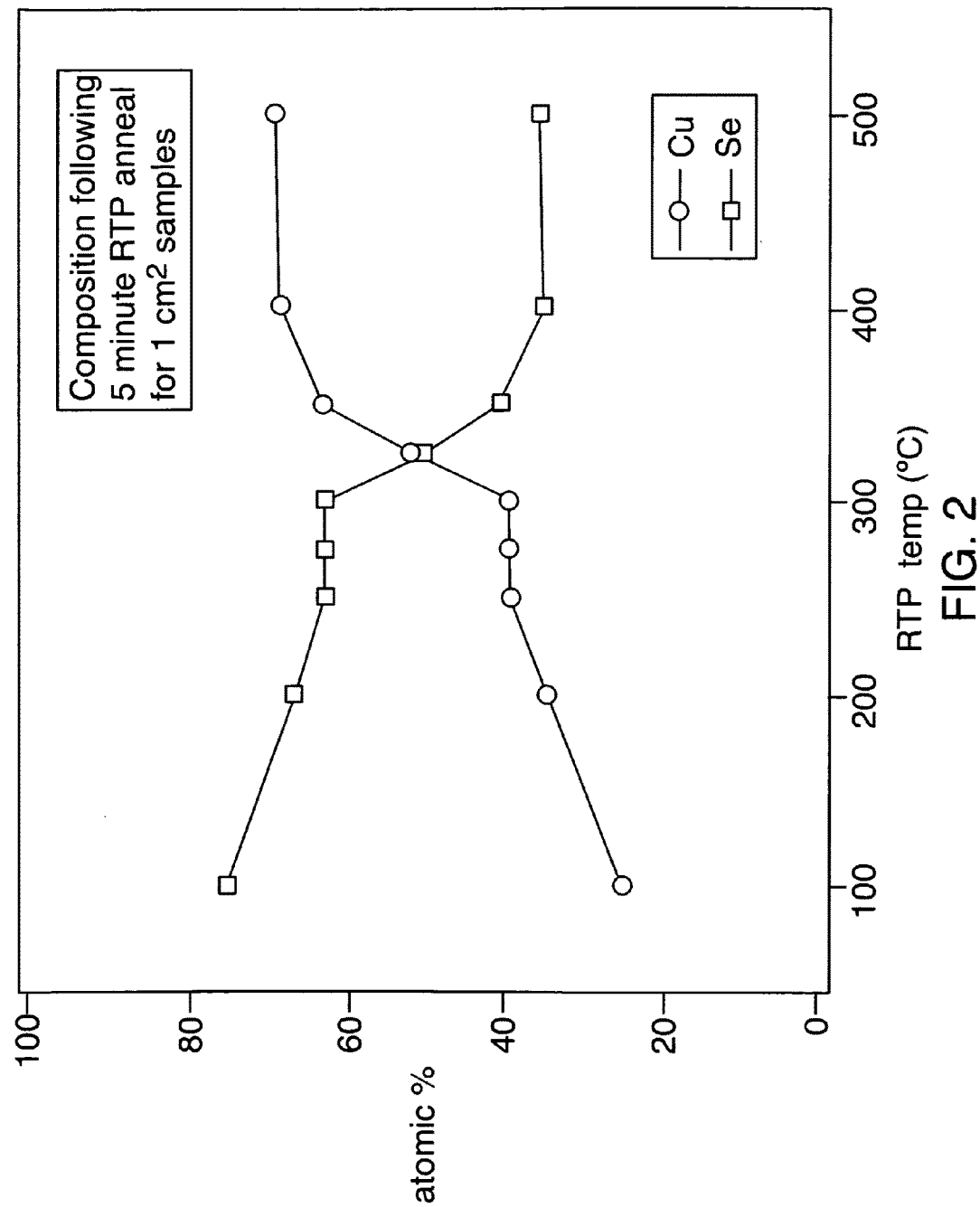
FIG. 2 is a trace view of atomic percent of copper and selenium as a function of processing temperature for a given time, representing exemplary embodiments.

The selection of a temperature and duration of heating have been determined to control the atomic ratio of copper to selenium when the precursor composition is deposited on the substrate (i.e., the relative amount of Cu and Se in the thin film) as shown in FIG. 2. Relatively low temperatures favor the formation of a selenium rich species ($CuSe_2$). Relatively higher temperatures favor the formation of the copper rich species ($Cu_2Se$). Thus, raising the reaction temperature tends to raise the copper content and lower the selenium content.

For example, deposition of the copper selenide liquid precursor at a temperature of from about 50° C. to 275° C., where about 200° C. favors formation of $CuSe_2$. If deposition is conducted at about 275° C. to 350° C., e.g., about 325° C., the predominant species is CuSe. As temperatures rise above about 350° C., the copper selenide liquid precursor gradually favors the formation of undesirable $Cu_2Se$. Accordingly, by controlling the temperature of the deposition process within the temperature range described above, the content of the copper selenide compounds can be precisely controlled.

In the formation of CIS and CIGS absorption layers, copper selenide layers containing substantially pure CuSe may be used. Accordingly, an exemplary method of forming a CIS or CIGS absorption layer is to deposit the copper selenide layer at a temperature from about 100° C. to 350° C., for example, about 325° C.

The exemplary liquid precursors allow for deposition by suitable deposition techniques such as drop coating, dip coating, spin coating, spraying, brushing, air brushing, ink jet application, stamping, printing, pouring, wiping, smearing, spray deposition, slot coating, and other methods of applying liquids to the surface of a substrate. For example, the deposition technique may be spray deposition or slot coating.

In an exemplary embodiment, the liquid precursor can be deposited in a single step heat treating method without resorting to multiple step processes in which the last heating step is rapid thermal processing (RTP). In particular, the liquid precursor may be heated and converted directly to the desirable copper selenide species as the liquid precursor is deposited on the substrate.

Rapid thermal processing (RTP) is defined herein as a heating regimen in which the target film is heated to a desired temperature in a short time, e.g., no more than about 10 minutes. The desired temperature is maintained until the heating process is completed.

In a further exemplary method of depositing a solid precursor on a substrate, the exemplary liquid precursor may be deposited on the substrate to form a solid precursor in the form of a thin film. Thereafter, the deposited liquid precursor is annealed at elevated temperatures to yield a copper selenide film containing $CuSe_2$ as the predominant species. In the exemplary method, heating may be conducted while the exemplary liquid precursor is being deposited on the substrate in a single step process.

It will be understood that the one step heating process is exemplary and not required. Thus, the liquid precursor described herein may be initially deposited on a substrate at relatively low temperatures and thereafter treated at higher temperatures including rapid thermal processing.

The Cu—Se containing liquid precursor representing an embodiment makes efficient use of selenium and in an exemplary embodiment obviates the need for multiple heating steps. Because Cu—Se is produced in a relatively pure form, the liquid precursors can be used effectively to facilitate the formation of, for example, CIS or GIGS with large crystal grains in a solid state reaction with In—Se and optional Ga—Se.

Figure 3:
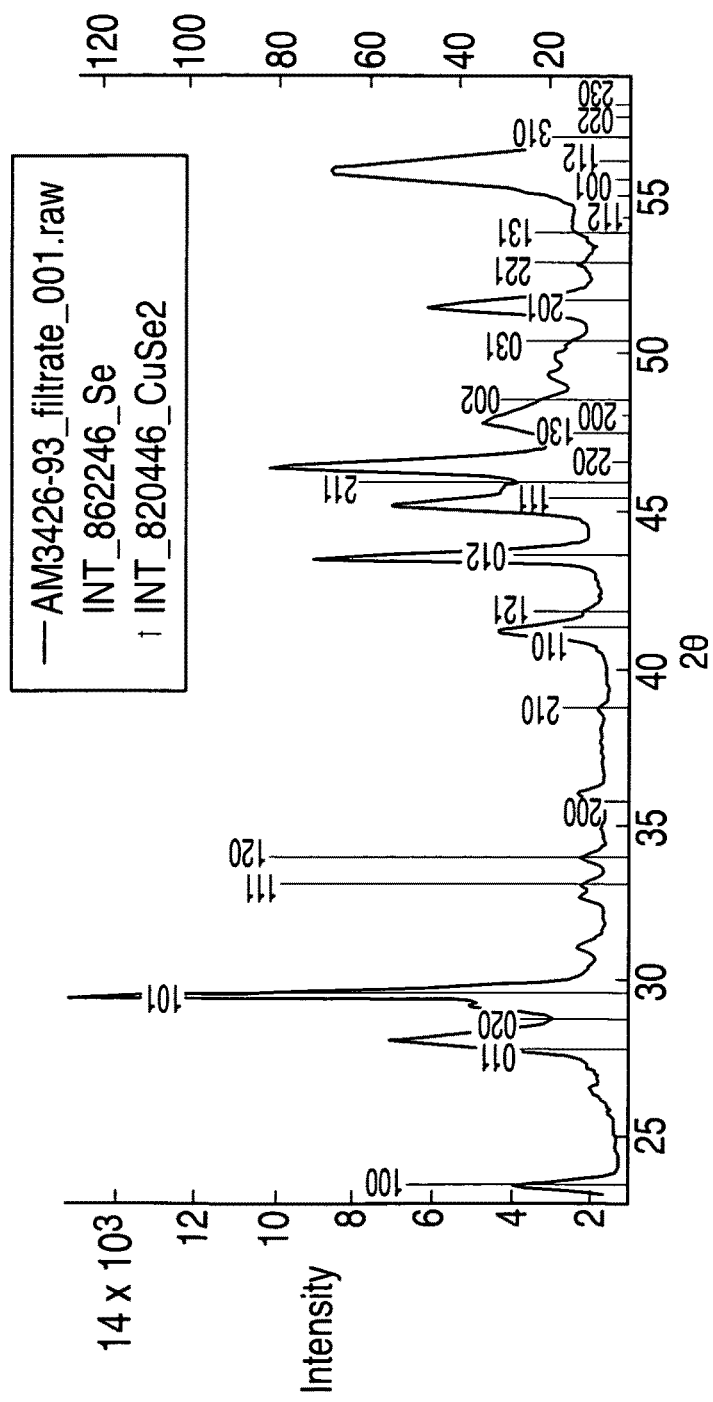
FIG. 3 is a trace view of an X-ray diffraction pattern representing an exemplary embodiment of a Cu—Se film drop-cast on glass at 200° C.

In reference to FIG. 3, an exemplary embodiment of the present copper selenide liquid precursor was dropcast on a glass substrate at about 200° C. and the resulting film was characterized by X-ray diffraction. The X-ray diffraction pattern of the film deposited at about 200° C. shows a number of peaks identifying crystalline phases of $CuSe_2$ and Se.

Figure 4:
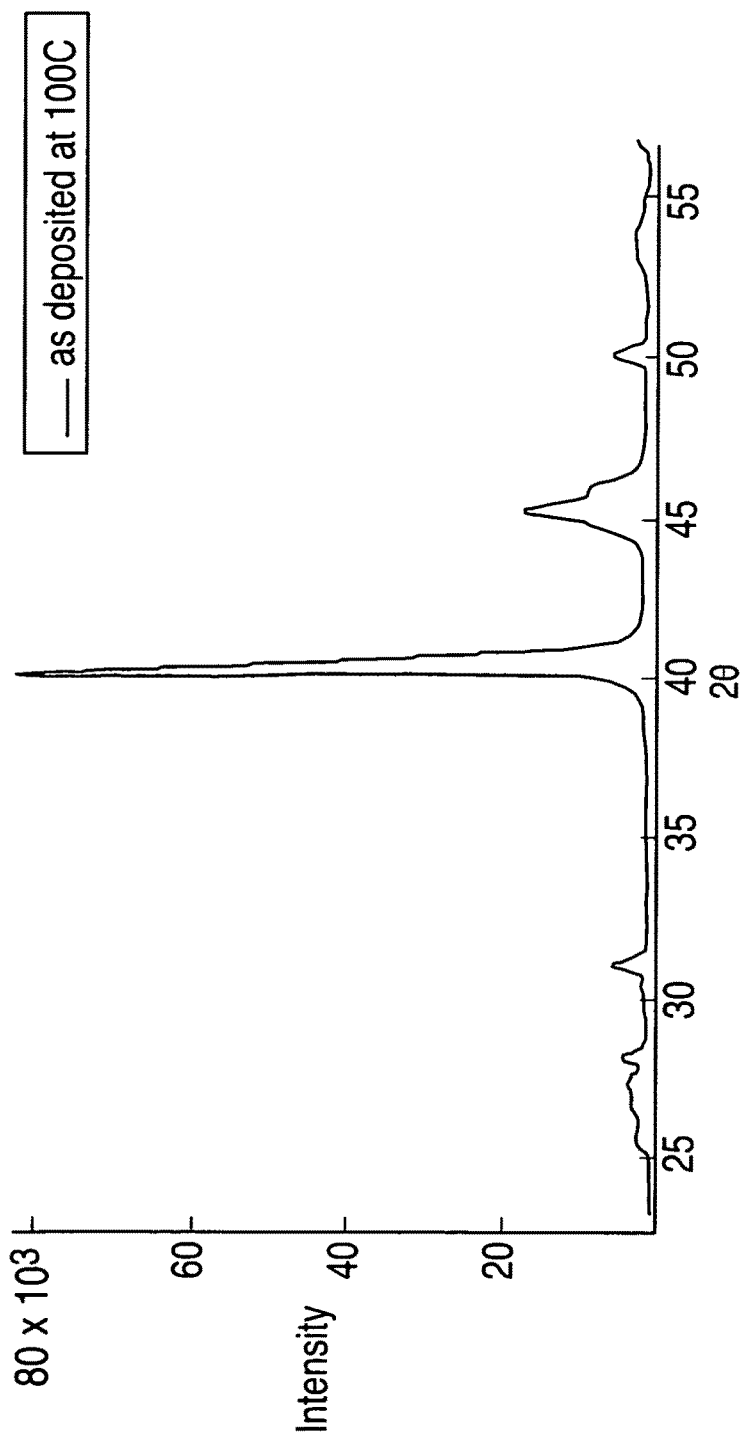
FIG. 4 is a trace view of an X-ray diffraction pattern representing an exemplary embodiment of a precursor film comprising layers of In—Ga—Se and Cu—Se supported on molybdenum and glass prior to thermal treatment.
Figure 5:
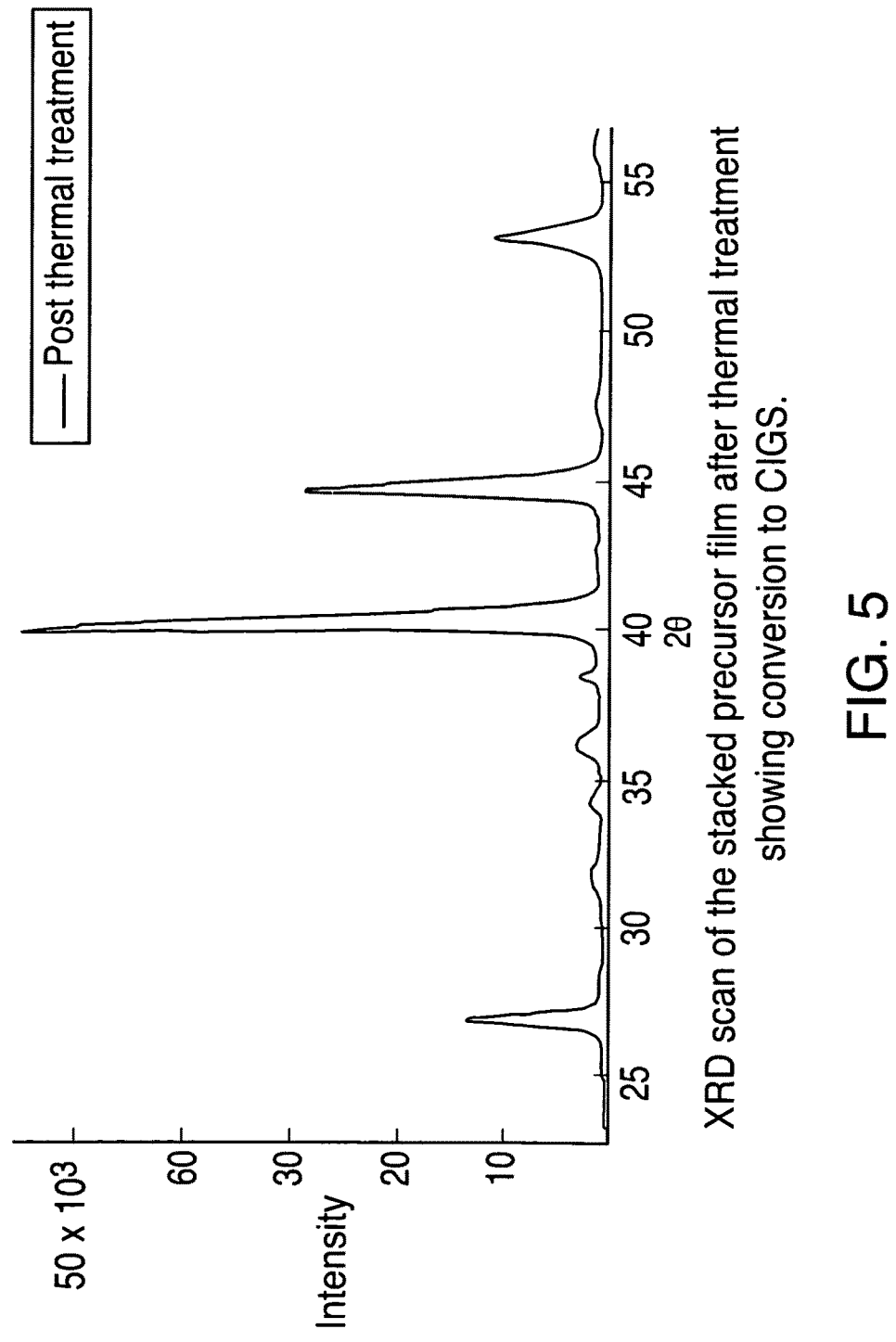
FIG. 5 is a trace view of an X-ray diffraction pattern representing an exemplary embodiment of a CIGS film formed after thermal treatment of the precursor film of FIG. 4.

In reference to FIG. 4, an exemplary embodiment of the present copper selenide liquid precursor was spray deposited at about 100° C. on a layer of indium, gallium and selenium to yield a stacked precursor film of In—Ga—Se and Cu—Se. The stacked precursor film overlays a layer of molybdenum supported on a glass substrate. The stacked precursor film is characterized by the X-ray diffraction pattern as shown in FIG. 4. The stacked precursor film was heat treated or annealed to convert the film into a CIGS light absorbing material. In reference to FIG. 5, the X-ray diffraction pattern confirms the formation of the CIGS light absorbing material from the stacked precursor film.

Figure 6:
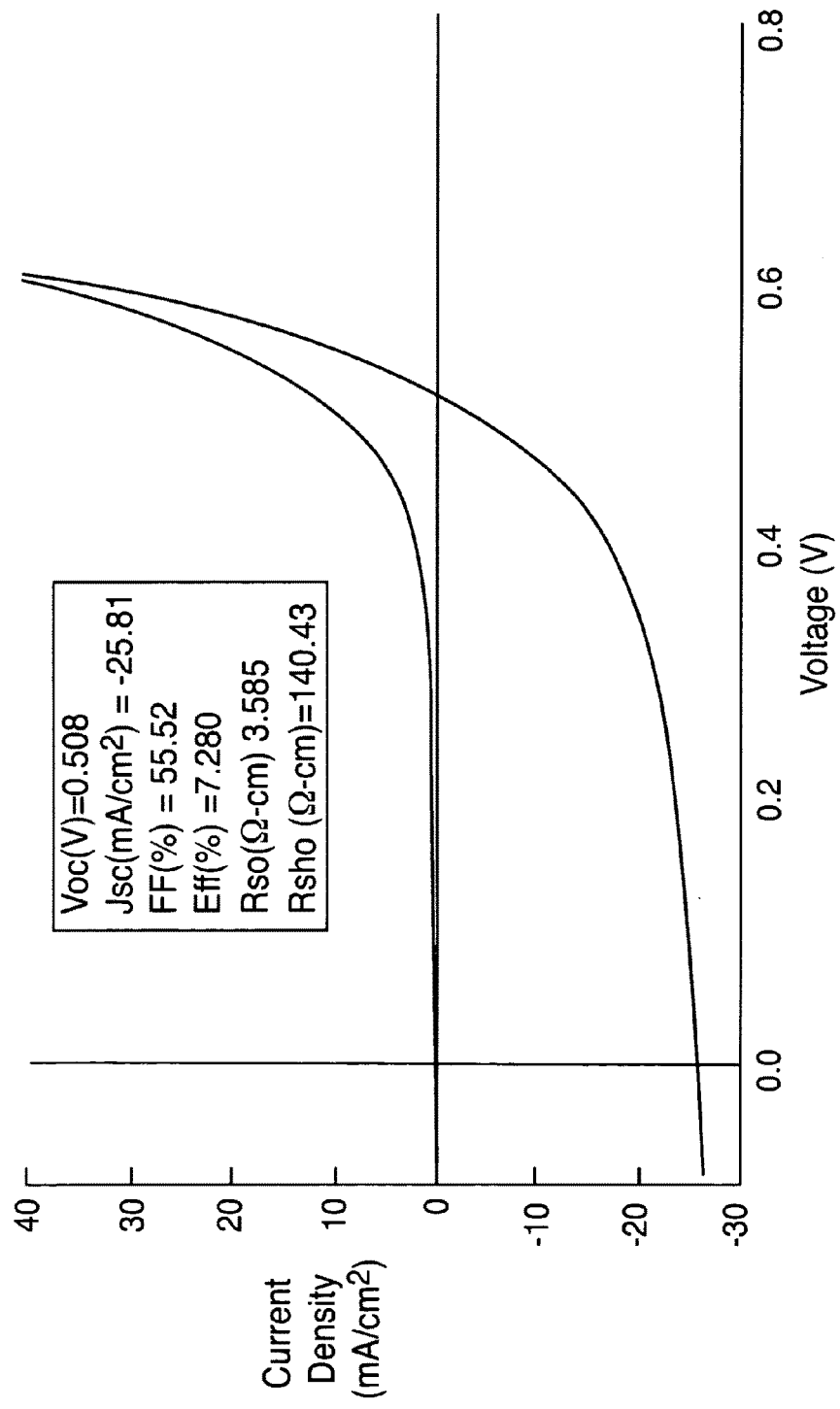
FIG. 6 is a trace view of a current-voltage (I-V) curve under illumination showing the performance characteristics of a photovoltaic device utilizing a CIGS film produced from a Cu—Se liquid precursor representing an exemplary embodiment.

In reference to FIG. 6, the CIGS light absorbing material was incorporated into a solar cell device through the addition of layers of cadmium sulfide and zinc oxide and metal contacts. The solar devices were tested using a solar simulator under 1.5 AMU illumination. Contact probes were placed on the front metal contacts and the back contact of molybdenum. The current was measured while performing a voltage sweep via the contact probes. From the resulting data, the amount of applied voltage required to stop the current flow, or open circuit voltage ($V_{oc}$), the current flow when no voltage is applied, or short circuit current, were determined. The short circuit current density ($J_{SC}$) was calculated from the measured short circuit current and the surface area of the device. The device efficiency is related to the fill factor (FF), which is determined from the sharpness of the device curve where a right angle indicates 100% FF. The device efficiency can be determined from the product of the values of the $V_{OC}$, $J_{SC}$ and FF.

Figure 7:
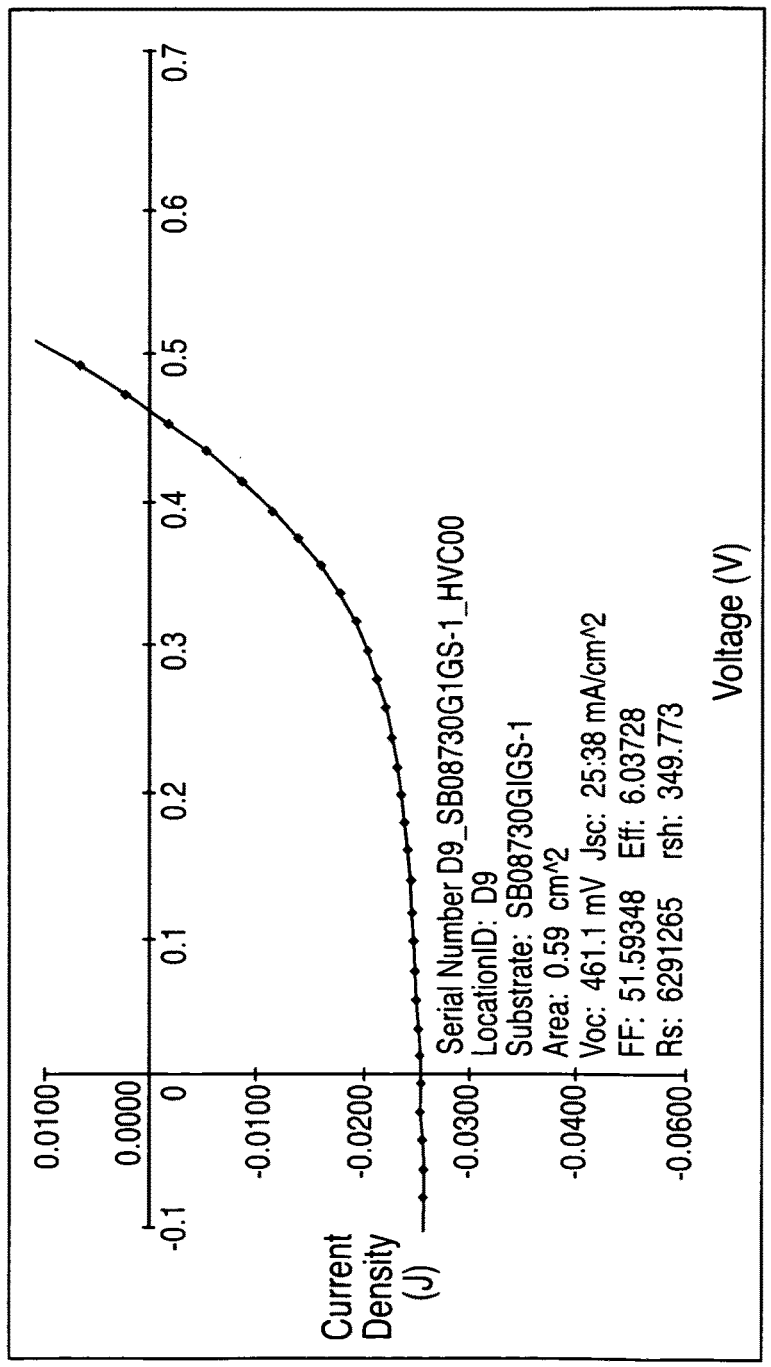
FIG. 7 is a trace view of a current-voltage (I-V) curve under illumination showing the performance characteristics of a photovoltaic device utilizing a CIGS film produced from a Cu—Se precursor deposited through physical vapor deposition (PVD).

The data as shown in FIG. 6 indicates the performance characteristics of a solar cell device fabricated with the present Cu—Se liquid precursor. The data as shown in FIG. 7 indicates the performance characteristics of a solar cell device fabricated with Cu—Se precursor deposited via physical vapor deposition. A comparison of the performance characteristics of FIGS. 6 and 7 show that the solar cell device fabricated with the present Cu—Se liquid precursor exhibited better efficiency than the PVD Cu—Se-based solar cell device.

EXAMPLES

Specific embodiments will now be further described by the following, nonlimiting examples which will serve to illustrate in some detail various features. The following examples are included to facilitate an understanding of ways in which an embodiment may be practiced. It should be appreciated that the examples, which follow represent embodiments discovered to function well in practice. However, it should be appreciated that many changes can be made in the exemplary embodiments which are disclosed while still obtaining like or similar results without departing from the spirit and scope of the claims. Accordingly, the examples should not be construed as limiting the scope of the claims.

Example 1

A solution of selenium in ethylene diamine was prepared by placing selenium powder (2.38 g, 0.030 mole) and ethylene diamine (40 mL) in a flask under a nitrogen atmosphere and adding anhydrous hydrazine (0.160 g, 0.005 mole). The resulting red solution was added over a 45 min period to a stirred solution of copper formate (1.54 g, 0.010 mole) in 40 mL of pyridine to produce a dark red solution containing a small amount of solid precipitate. The precipitate was removed by filtration and the composition of the precursor solution was measured using Inductively Coupled Plasma Atomic Emission Spectroscopy (ICP-AES). The precursor composition found was 25.4 atomic % Cu and 74.6 atomic % Se (Se/Cu=2.94). The precursor solution was spray deposited on a glass substrate at 250° C. and the composition of the resulting film was determined by X-ray fluorescence (XRF). The composition found was 33 atomic % Cu and 66 atomic Se (Se/Cu=2.0).

Similar results were obtained when copper formate was dissolved in ethylene diamine or ethanolamine in place of pyridine.

Example 2

A solution of copper nitrate (1.21 g, 0.005 mole) in ethylene diamine was prepared by adding 20 mL of ethylene diamine slowly to the solid in a flask under nitrogen atmosphere. This was added to a solution of selenium in ethylene diamine prepared as described in Example 1 from 0.79 g Se (0.010 mole), 20 mL ethylene diamine and 0.080 g hydrazine (0.0025 mole), resulting in a dark red solution with a small amount of precipitate. The precipitate was removed by filtration and the composition of the precursor solution was measured using ICP-AES. The precursor composition found was 25.6 atomic % Cu and 74.4 atomic % Se (Se/Cu=2.91).

Example 3

A solution of selenium in ethylene diamine was prepared as described in Example 1 from 2.38 g Se (0.030 mole), 40 mL ethylene diamine and 0.160 g hydrazine (0.005 mole) and added to a solution of copper chloride (1.70 g, 0.010 mole) in ethylene diamine (40 mL) and water (1 mL) over a period of 30 min. The solution turned dark red and a small amount of precipitate formed. The precipitate was removed by filtration.

Example 4

A solution of copper trifluoromethanesulfonate (1.10 g, 0.005 mole) in ethylene diamine was prepared by adding 20 mL of ethylene diamine slowly to the solid in a flask under nitrogen atmosphere. This was added to a solution of selenium in ethylene diamine prepared as described in Example 1 from 0.79 g Se (0.010 mole), 30 mL ethylene diamine and 0.080 g hydrazine (0.0025 mole), resulting in a dark red solution with a small amount of precipitate. The precipitate was removed by filtration.

While a number of exemplary aspects and embodiments have been discussed above, those of skill in the art will recognize certain modifications, permutations, additions, and sub-combinations thereof. It is therefore not intended that the following appended claims and claims hereafter introduced and interpreted to include all such modifications, permutations, additions, and sub-combinations as are within their true spirit and scope.

What is claimed is:

1. A method of preparing a liquid copper selenide precursor, the method comprising: reducing elemental selenium with a stoichiometric amount of hydrazine in the presence of a first solvent to yield a first solution comprising $Se_2^{2-}$; and combining the first solution with a second solution comprising a copper salt and a second solvent to yield the liquid copper selenide precursor comprising soluble $CuSe_2$, wherein the liquid copper selenide precursor is essentially hydrazine-free.

2. The method of claim 1, wherein at least one of the first solvent or the second solvent comprises a primary amine or a secondary amine.

3. The method of claim 1, wherein at least one of the first solvent or the second solvent comprises at least one of ethylene diamine, ethanolamine, or diethylene triamine.

4. The method of claim 3, wherein at least one of the first solvent or the second solvent is ethylene diamine.

5. The method of claim 1, wherein the copper salt comprises at least one of copper chloride, copper bromide, copper iodide, copper acetate, copper formate, copper nitrate, or copper trifluoromethanesulfonate.

6. The method of claim 1, further comprising separating any precipitate formed during the combining.

7. The method of claim 6, wherein the separating comprises at least one of filtration or centrifugation.

8. The method of claim 1, wherein the liquid copper selenide precursor comprises copper having a concentration between 0.08 M and 0.10 M.

9. A method of depositing a solid copper selenide precursor on a substrate, the method comprising:
applying the liquid copper selenide precursor prepared by the method of claim 1 to the substrate; and
heating the liquid copper selenide precursor to a temperature and for a time sufficient to yield the deposited solid copper selenide precursor on the substrate.

10. The method of claim 9, wherein the deposited solid copper selenide precursor is a thin film.

11. The method of claim 9, wherein the temperature is at least 50° C.

12. The method of claim 11, wherein the temperature is between 50° C. and 275° C.

13. The method of claim 9, wherein the deposited solid copper selenide precursor comprises $CuSe_2$.

14. The method of claim 9, wherein the applying comprises at least one of drop coating, dip coating, spin coating, spraying, brushing, air brushing, ink jet application, stamping, printing, pouring, wiping, smearing, spray deposition, or slot coating.

15. The method of claim 9, wherein the liquid copper selenide precursor comprises copper having a concentration between 0.08 M and 0.10 M.

* * * * *